US009833988B2

(12) United States Patent
Li

(10) Patent No.: US 9,833,988 B2
(45) Date of Patent: Dec. 5, 2017

(54) POCKET MULTIFUNCTIONAL ELECTRONIC EXPERIMENT DEVICE

(71) Applicant: Rongchang Li, Guangdong (CN)

(72) Inventor: Rongchang Li, Guangdong (CN)

( * ) Notice: Subject to any disclaimer, the term of this patent is extended or adjusted under 35 U.S.C. 154(b) by 0 days.

(21) Appl. No.: 15/329,261

(22) PCT Filed: Mar. 31, 2015

(86) PCT No.: PCT/CN2015/075570
§ 371 (c)(1),
(2) Date: Jan. 26, 2017

(87) PCT Pub. No.: WO2016/019735
PCT Pub. Date: Feb. 11, 2016

(65) Prior Publication Data

US 2017/0217154 A1 Aug. 3, 2017

(30) Foreign Application Priority Data

Aug. 8, 2014 (CN) .................... 2014 2 0447695 U

(51) Int. Cl.
*B41F 16/00* (2006.01)

(52) U.S. Cl.
CPC .................................. *B41F 16/00* (2013.01)

(58) Field of Classification Search
CPC ... B41F 16/00; B41F 16/0006; B41M 5/0058; B41M 5/0041; B41M 5/0052
See application file for complete search history.

(56) References Cited

U.S. PATENT DOCUMENTS

| | | | | |
|---|---|---|---|---|
| 5,382,313 A * | 1/1995 | Eminger | B41F 16/00 269/271 |
| 2011/0249070 A1* | 10/2011 | Mason | B41J 2/325 347/188 |
| 2014/0292989 A1* | 10/2014 | Matsuda | B41J 2/325 347/198 |
| 2016/0009028 A1* | 1/2016 | Tjellesen | B41J 2/32 425/375 |

* cited by examiner

*Primary Examiner* — Kristal Feggins

(57) ABSTRACT

Disclosed is a pocket multifunctional electronic experiment device, comprising a thermal transfer printer (2), a control box (1), a solder bath (4) and a board holder (3). The thermal transfer printer (2) is composed of two halves folded together; wherein an upper heat resisting sponge (12) is stuck onto an upper heating board (11) while a lower heat resisting sponge (13) is placed on a lower heating board (14) and removable; the heating boards (11,14) are connected to the AC power supply via the control box (1); an upper metal support (9) is connected to a lower metal support (16) via an axis of rotation (91), an upper handle and a lower handle (5,19) are respectively configured on the sides of the metal supports opposite to the axis (91); the upper handle (5) is provided with a clasp (6) while the lower handle (19) is provide with a toggle correspondingly.

5 Claims, 4 Drawing Sheets

2
3
4
1

POCKET MULTIFUNCTIONAL ELECTRONIC EXPERIMENT DEVICE

FIELD OF THE INVENTION

The present invention relates to electronic technology, in particular, to a pocket multifunctional electronic experiment device.

BACKGROUND OF THE INVENTION

In the 21st century, the information age, the electronic technology advances rapidly, development of electronic products has been focusing on becoming miniature, multifunctional, and intellectual, the circuits on the board become complex and dense, and almost all the electronic products utilized the print circuit board (PCB). At present, the experiments for developing the electronic products, especially the experiments for designing the double-sided circuit board, are accomplished by utilizing the standard industrial manufacturing flow of boards, which requires not only a vast expense but also a long development period; meanwhile, amateurs carry out the thermal transfer printing of the double-sided PCB by using a rubber covered roller film laminator, which is not only time consuming and electricity consuming but also complex and troublesome, besides, it usually becomes ruined due to the mismatch between the top laminate and the bottom laminate.

On the other hand, in the experiments for improving the electronic products and training the personnel on electronics, it might be necessary to carry out the soldering and de-soldering of the surface mounted devices (SMD) and through hole devices (THD) in a small batch, but using the soldering iron is a waste of time and the soldering quality can not be assured. However, purchasing a solder pot and a reflow oven for batch manufacturing of electronic products which are bulky and electricity consuming is too wasteful. Therefore, for manufacture of the experimental circuit boards in a small batch, it is more economical and eco-friendly to make use of the character of rapid heating and auto temperature maintaining of the PTC (positive temperature coefficient) materials to accomplish multiple steps in a single machine.

In conclusion, it is necessary to develop a highly automatic integrated device capable of highly precise thermal transfer printing, soldering and de-soldering of SMD and THD in order to serve as a multifunctional experimental manufacturing device for the information electronic labs of various schools, colleges and universities to cultivate innovative personnel, a pocket multifunctional experiment device suited to arenas for the competitors of the electronic design competitions, and a multifunctional experimental manufacturing device for electronic amateurs and enterprises to develop electronic products in low cost and high efficiency.

SUMMARY OF THE INVENTION

To solve the preceding problems, the present invention provides a pocket multifunctional electronic experiment device which is highly integrated and small-sized to satisfy the requirements of the experimenters.

The pocket multifunctional electronic experiment device according to the present invention comprises a thermal transfer printer, a control box, a solder bath and a board holder wherein the thermal transfer printer is in the form of clamshell composed of two halves folded to each other;

wherein an upper heat resisting sponge for the upper half is stuck onto a surface of an upper heating board while a lower heat resisting sponge for the lower half is placed on a surface of a lower heating board and removable; the upper and lower heating boards are connected to the AC power supply via the control box;

an upper metal support of the upper half is connected to a lower metal support of the lower half via an axis of rotation, an upper handle and a lower handle are respectively configured on the sides of the upper and lower metal supports opposite to the axis;

the upper handle is provided with a clasp while the corresponding spot of the lower handle is provide with a toggle.

Further, the upper half further comprises a first plastic casing, an upper thermal insulation board, an upper thermal insulation pad; wherein the first plastic casing, the upper thermal insulation board, the upper metal support, the upper thermal insulation pad and the upper heating board are arranged in turn from external to internal of the upper half.

Further, the lower half further comprises a second plastic casing, a lower thermal insulation board, a lower thermal insulation pad; wherein the second plastic casing, the lower thermal insulation board, the lower metal support, the lower thermal insulation pad and the lower heating board are arranged in turn from external to internal of the lower half.

Further, both the upper and lower heating boards are high temperature PTC heating boards.

Further, the space between the upper and lower handles and the axis of rotation are both wider than twice the width of the heating board.

In conclusion, by sticking a heat resisting sponge onto the upper heating board and placing another heat resisting sponge on the lower heating board, multiple experimental functions can be achieved by the experiment device through regulating the thermal sponges and control box, such as thermal transfer printing, soldering of SMD and THD so that the requirements of the experimenters is satisfied, meanwhile, the device is small in size, light in weight, less expensive, and long lasting, all these advantages enable it to conform the principle of energy-saving and eco-friendly.

Furthermore, the electronic device according to the present invention is configured to be pocket and a structure of double PTC heating boards pressing against each other is utilized. The space between the upper and lower handles and the axis of rotation are both wider than twice the width of the heating board which enables the maximum transfer printing area to reach four times the area of the heating board and makes it convenient to enlarge the transfer printing area.

DETAILED DESCRIPTION OF THE PREFERRED EMBODIMENTS

Hereinafter, the embodiments of the present invention will be described distinctly and completely accompanied with the drawings.

Figure 1:
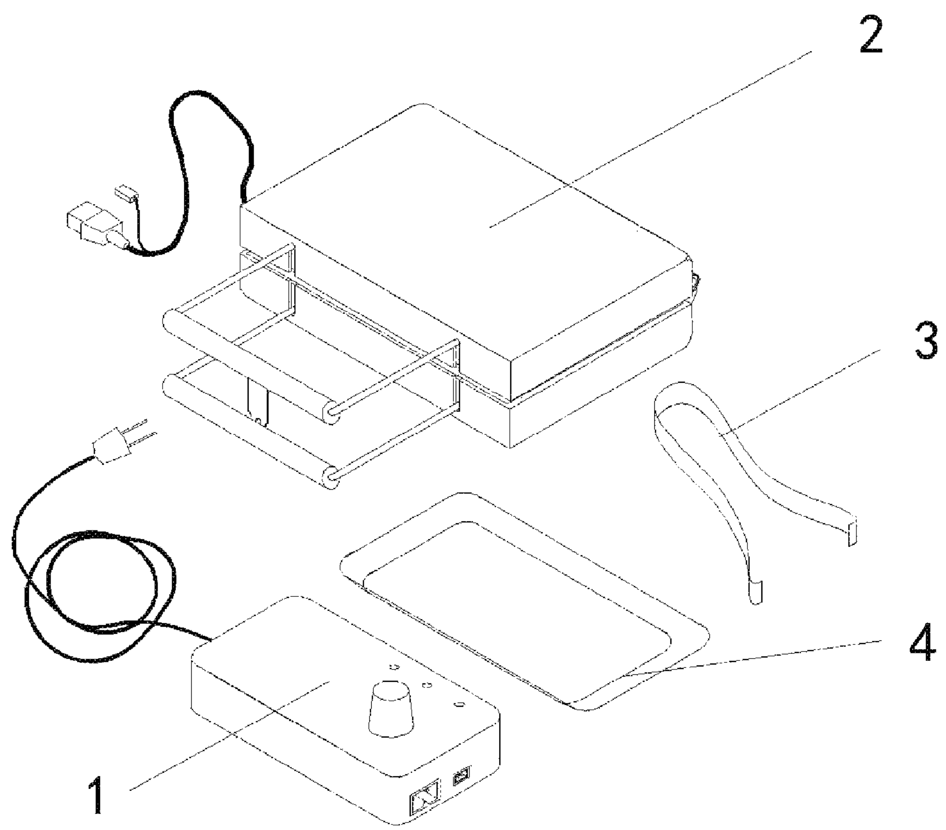
FIG. 1 is a structural diagram of a pocket multifunctional electronic experiment device according to the present invention.
Figure 2:
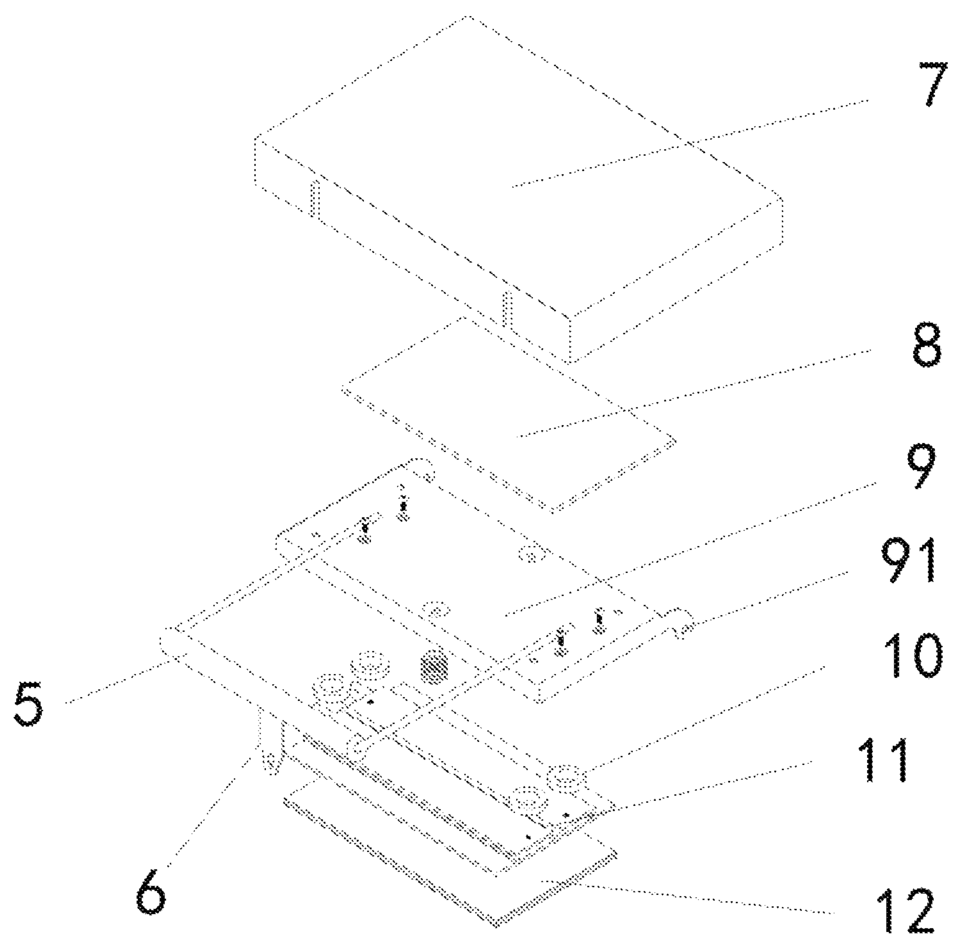
FIG. 2 is an exploded view of an upper half of the thermal transfer printer according to the present invention.
Figure 3:
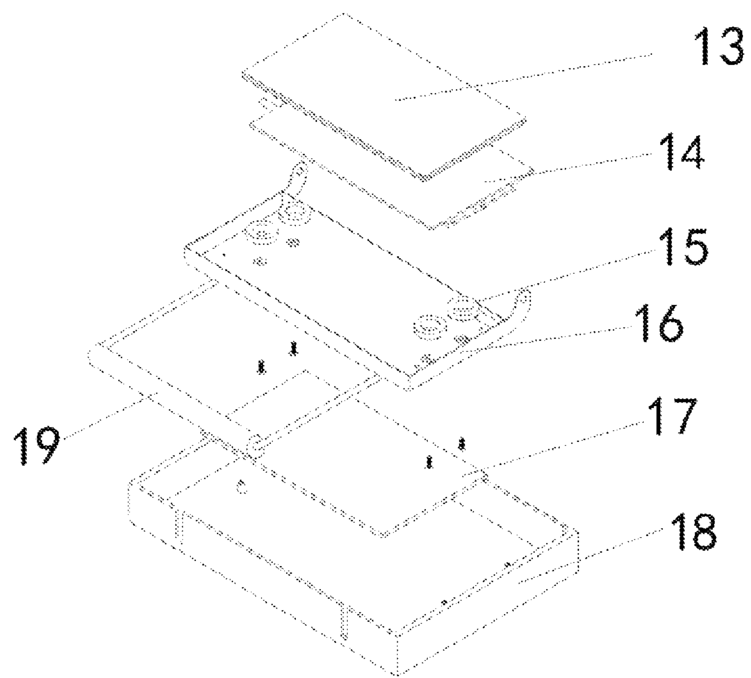
FIG. 3 is an exploded view of a lower half of the thermal transfer printer according to the present invention.

FIG. 1 is a structural diagram of a pocket multifunctional electronic experiment device according to the present invention. The experiment device comprises a control box 1, a thermal transfer printer 2, a board holder 3 and a solder bath 4. The control box 1 is connected to the thermal transfer printer 2 via a joint of a plug and a jack.

Wherein the thermal transfer printer is in the form of clamshell composed of two halves folded to each other. FIG. 2 is an exploded view of an upper half of the thermal transfer printer while FIG. 3 is an exploded view of a lower half thereof; As shown in FIG. 2, the upper half is formed by arranging a first plastic casing 7, an upper thermal insulation board 8, an upper metal support 9, an upper thermal insulation pad 10, an upper heating board 11 and an upper heat resisting sponge 12 in turn from external to internal. As shown in FIG. 3, the lower half is formed by arranging a second plastic casing 8, a lower thermal insulation board 17, a lower metal support 16, a lower thermal insulation pad 15, a lower heating board 14 and a lower heat resisting sponge 13 in turn from external to internal. The distinction between the upper and lower halves is the upper heat resisting sponge 12 for the upper half is stuck onto a surface of an upper heating board 8 while the lower heat resisting sponge 13 for the lower half is placed on a surface of a lower heating board 17 and is able to be mounted and removed according to practical need.

In the embodiment, the upper and lower heating boards 8,17 are connected to the AC power supply via the control box which is configured for controlling the time and temperature of the thermal transfer printing and soldering. The control box comprises a temperature controller and a time controller.

In the embodiment, the upper metal support 9 for the upper half and the lower metal support 16 for the lower half are joined together via an axis of rotation 91. An upper handle 5 and a lower handle 19 are respectively provided on the sides of the upper and lower metal supports, opposite to the axis of rotation 91. The upper handle 5 is provided with a clasp 6 while the corresponding spot of the lower handle 19 is provide with a toggle.

In the embodiment, both the upper and lower heating board 8, 17 may be but not limited to high temperature PTC heating boards.

In the embodiment, the space between the upper and lower handles and the axis of rotation 91 are both bigger than twice the width of the heating board. Hereby the transfer printing area can be enlarged and the utility of the thermal transfer printing can be improved.

Figure 4:
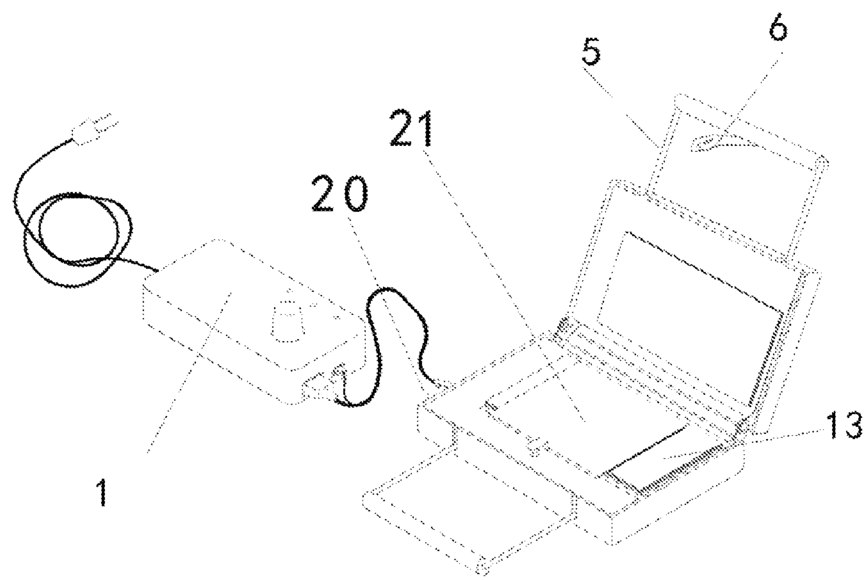
FIG. 4 is a diagram showing the thermal transfer printing function of the pocket multifunctional electronic experiment device according to the present invention.

The experiment device according to the present invention is able to realized a variety of functions such as thermal transfer printing of the single-sided and double-sided PCB, soldering and de-soldering of SMD and THD, so as to show the functions of the present invention more clearly, the FIG. 4 shows the thermal transfer printing function of the pocket multifunctional electronic experiment device. As shown in FIG. 4, on the thermal transfer printer 2 is provided a switch 20 which can switch between the two main functions, i.e. thermal transfer printing and soldering. When thermal transfer printing is conducted, the lower heat resisting sponge 13 is placed upon the lower heating board 14, and a transfer paper with a printed circuit image, a copper clad laminate 21 to be printed are placed upon the lower heat resisting sponge 13. And then the upper half and the lower half are closed together, and join the clasp 6 and toggle together. Next, the plug of the thermal transfer printer is inserted into the corresponding jack on the control box to establish a connection between them, meanwhile, the switch is turned to thermal transfer printing and the time is set, then the thermal transfer printing starts once the control box is powered on. When the set time is up, there will be a reminder of sound and light.

Figure 5:
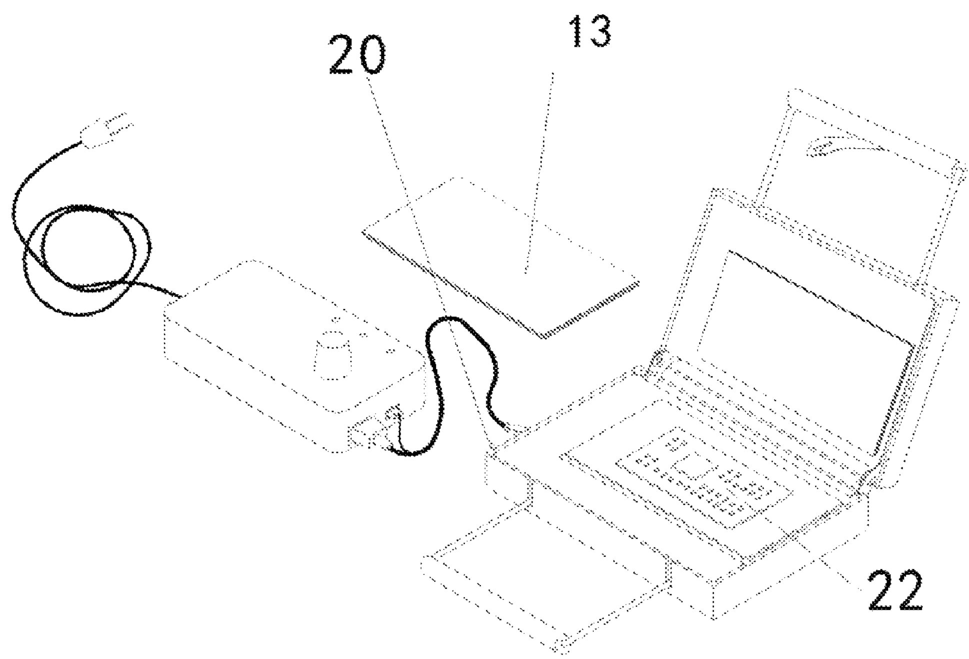
FIG. 5 is a diagram showing the surface mounted devices (SMD) soldering function of the pocket multifunctional electronic experiment device according to the present invention.

FIG. 5 is a diagram showing the surface mounted devices soldering function of the pocket multifunctional electronic experiment device. As shown in FIG. 5, when the device is used for PCB soldering, the lower heat resisting sponge 13 is removed from the lower heating boars 14 and placed aside, the thermal transfer printer 2 is connected to the control box 1 and the switch is turned to soldering, and the time is set to be 3 minutes, the device is powered on and the heating boards start to work. When the 3 minutes is up, the PCB 16 mounted with solder paste and surface mounted devices is placed on the heating board and stays there for several seconds until the solder melts, and then the PCB 16 is taken out. The procedure of the de-soldering of the surface mounted devices is similar.

Figure 6:
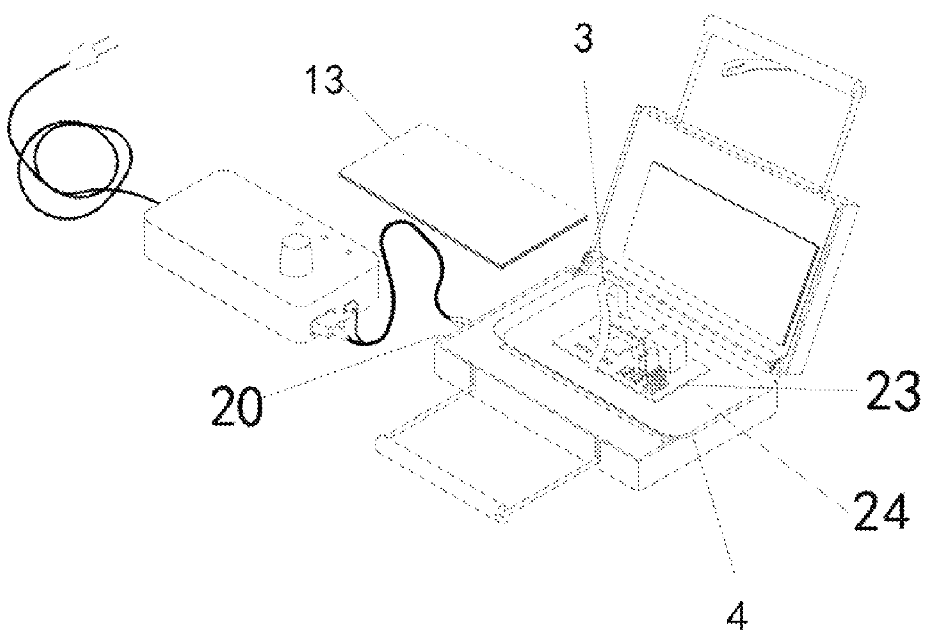
FIG. 6 is a diagram showing the through hole devices (THD) soldering function of the pocket multifunctional electronic experiment device according to the present invention.

FIG. 6 is a diagram showing the through hole devices soldering function of the pocket multifunctional electronic experiment device; As shown in FIG. 6, when the device is used for soldering of the through hole devices, the lower heat resisting sponge 13 is removed from the lower heating board 14 and placed aside, and a solder bath 4 is place on the lower heating board 14, wherein the depth of the solder bath 4 is about 20 mm, and the depth of the solder inside it is about 10 mm, the circuit connection stays the same as before, the switch 20 is turned to soldering, and the time knob is turn to the rightmost, the device is powered on and the heating boards start to work. When the solder are totally melted, the temperature goes on rising to 270° C., at that time, a reminder is given out automatically, the PCB 23 mounted with through hole devices (the feet of the devices extending out of the PCB are trimmed to be within 5 mm) held by the board holder 3, is socked in the soldering flux firstly and then placed on the surface of the solder, and thereby the soldering is completed. The soldering can be executed successively by the device and the procedure of de-soldering of the through hole devices is similar.

In conclusion, by sticking a heat resisting sponge onto the upper heating board and placing another heat resisting sponge on the lower heating board, multiple experimental functions can be achieved by the experiment device through regulating the thermal sponges and control box, such as thermal transfer printing of single-sided and double-sided PCB, soldering and de-soldering of SMD and THD so that the requirements of the experimenters is satisfied, meanwhile, the device is small in size, light in weight, less expensive, and long lasting, all these advantages enable it to conform the principle of energy-saving and eco-friendly.

Furthermore, the electronic device according to the present invention is configured to be pocket and a structure of double PTC heating boards pressing against each other is utilized.

The space between the upper and lower handles and the axis of rotation are both bigger than twice the width of the heating board which enables the maximum transfer printing area to reach four times the area of the heating board and makes it convenient to enlarge the transfer printing area.

Hereinbefore described are only preferred embodiments of the present invention, which do not mean any limit to the scope of the protection of the present invention. It should be noted, any modification or improvement carried out by the skilled in the art within the principle of the present invention should be taken as within the scope of protection of the present invention.

What is claimed is:

1. A pocket multifunctional electronic experiment device, comprising a thermal transfer printer, a control box, a solder bath and a board holder wherein the thermal transfer printer is in the form of clamshell composed of two halves folded to each other;

an upper heat resisting sponge for the upper half is stuck onto a surface of an upper heating board while a lower heat resisting sponge for the lower half is placed on a surface of a lower heating board and removable; the upper and lower heating boards are connected to the AC power supply via the control box;

an upper metal support of the upper half is connected to a lower metal support of the lower half via an axis of rotation, an upper handle and a lower handle are respectively configured on the sides of the upper and lower metal supports opposite to the axis;

the upper handle is provided with a clasp while the corresponding spot of the lower handle is provide with a toggle.

2. The experiment device according to claim 1, wherein the upper half further comprises a first plastic casing, an upper thermal insulation board, an upper thermal insulation pad; wherein the first plastic casing, the upper thermal insulation board, the upper metal support, the upper thermal insulation pad and the upper heating board are arranged in turn from external to internal of the upper half.

3. The experiment device according to claim 1, wherein the lower half further comprises a second plastic casing, a lower thermal insulation board, a lower thermal insulation pad; wherein the second plastic casing, the lower thermal insulation board, the lower metal support, the lower thermal insulation pad and the lower heating board are arranged in turn from external to internal of the lower half.

4. The experiment device according to claim 1, wherein both the upper and lower heating boards are high temperature PTC heating boards.

5. The experiment device according to claim 1, wherein the space between the upper and lower handles and the axis of rotation are both wider than twice the width of the heating board.

* * * * *